United States Patent [19]

Taguchi

[11] Patent Number: 5,321,659
[45] Date of Patent: Jun. 14, 1994

[54] SIGNAL AMPLIFIER CIRCUIT AND SEMICONDUCTOR MEMORY DEVICE USING THE SAME

[75] Inventor: Masao Taguchi, Sagamihara, Japan

[73] Assignee: Fujitsu Limited, Kawasaki, Japan

[21] Appl. No.: 677,702

[22] Filed: Mar. 29, 1991

[30] Foreign Application Priority Data

Mar. 30, 1990 [JP] Japan .................. 2-83761

[51] Int. Cl.[5] .............................................. G11C 7/06
[52] U.S. Cl. ..................................... 365/207; 365/208
[58] Field of Search ............... 365/205, 207, 208, 191, 365/226, 227, 189.07; 330/252, 253, 257, 288; 307/530

[56] References Cited

U.S. PATENT DOCUMENTS

| 4,649,301 | 3/1987 | Van Tran | 307/530 |
| 4,661,779 | 4/1987 | Okamoto | 330/253 |
| 4,713,797 | 12/1987 | Morton et al. | 330/257 X |
| 4,907,201 | 3/1990 | Minami et al. | 365/207 |
| 4,984,206 | 1/1991 | Komatsu et al. | 365/208 |
| 5,029,138 | 7/1991 | Iwashita | 365/207 X |

FOREIGN PATENT DOCUMENTS

| 0244125 | 6/1987 | European Pat. Off. . |
| 2379193 | 8/1978 | France . |
| 0311610 | 12/1989 | Japan | 330/257 |

Primary Examiner—Seungsook Ham
Attorney, Agent, or Firm—Armstrong, Westerman, Hattori, McLeland & Naughton

[57] ABSTRACT

A signal amplifier circuit suitable for a semiconductor memory device includes a first current mirror circuit for outputting a first current to a first signal line and for outputting a second mirror current, and a second current mirror circuit for outputting a third current to a second signal line and for outputting a fourth mirror current. The first and second signal line form a pair of complementary signal lines. The amplifier circuit also includes a third current mirror circuit for receiving the second and fourth mirror currents and for outputting an output signal based on a potential difference between the first and second data signal lines.

27 Claims, 13 Drawing Sheets

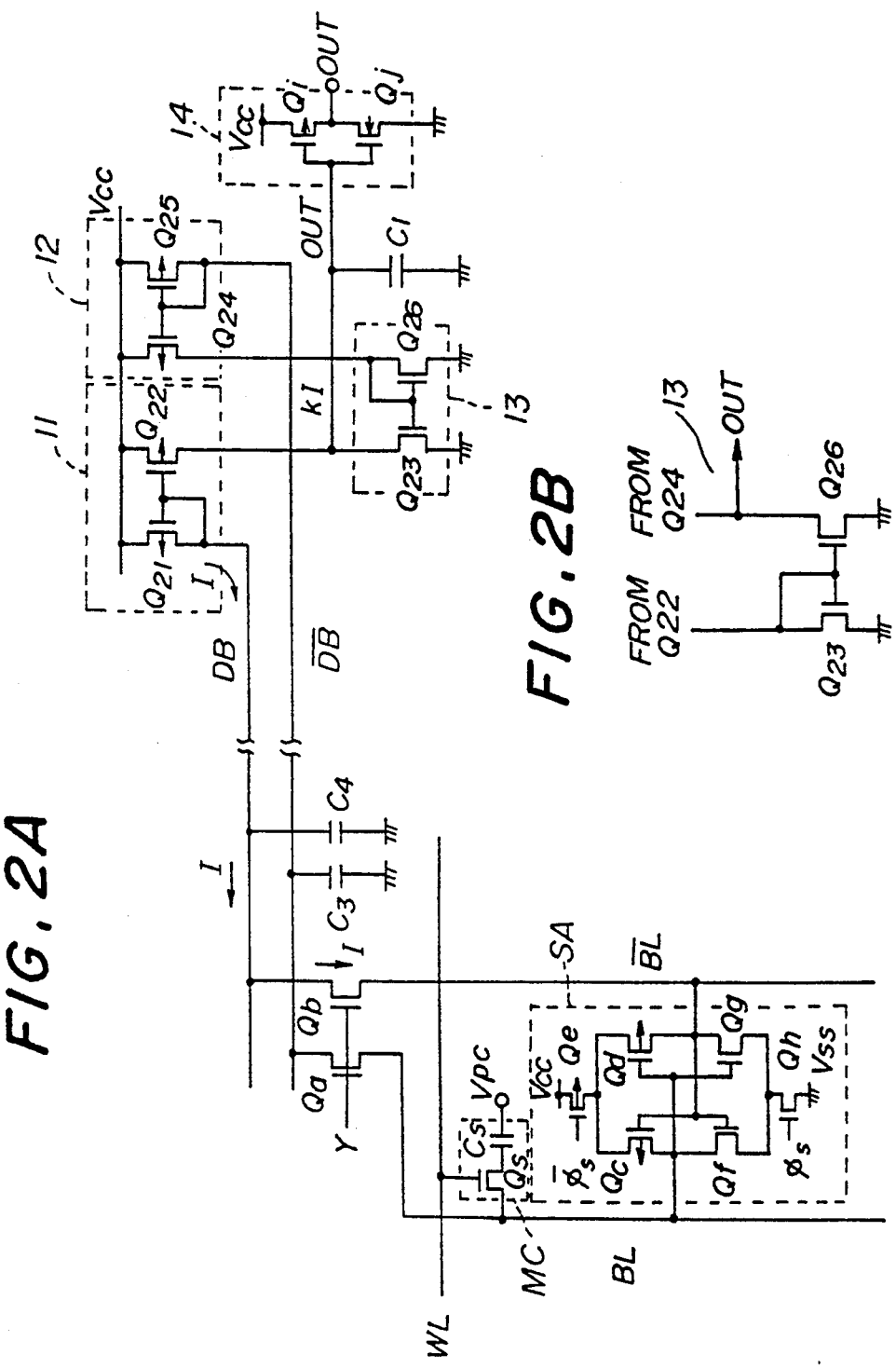
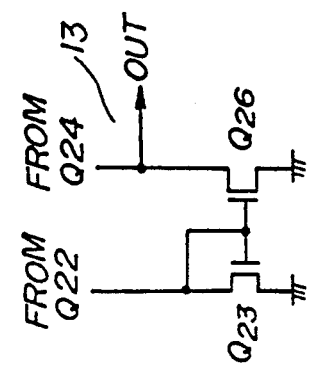
FIG. 2A
FIG. 2B

TO LATCH CIRCUIT 40

SIGNAL AMPLIFIER CIRCUIT AND SEMICONDUCTOR MEMORY DEVICE USING THE SAME

BACKGROUND OF THE INVENTION

The present invention generally relates to semiconductor memory devices such as dynamic random access memories and static random access memories. More particularly, the present invention is concerned with a current amplifier circuit which amplifies a signal on a data bus line or an equivalence of a field effect transistor memory of a MIS (Metal Insulator Semiconductor) type, such as a MOS (Metal Oxide Semiconductor) type.

FIG. 1 is a circuit diagram of a conventional data bus signal amplifier circuit. As shown in FIG. 1, the conventional data bus signal amplifier circuit includes a data bus load circuit 1 and a data bus amplifier 2. The data bus load circuit 1 is made up of n-channel MOS transistors (hereafter simply referred to as NMOS transistors) Q1 and Q2.

The NMOS transistors Q1 and Q2 function as load elements of data buses DB and $\overline{DB}$, and are diode-connected. The NMOS transistors Q1 and Q2 pull the data buses DB and $\overline{DB}$ up to a potential nearly equal to a high-potential power supply voltage Vcc. During a data readout operation, a sense amplifier SA coupled to bit lines BL and $\overline{BL}$ makes the potential of one of the bit lines BL and $\overline{BL}$ decrease toward a ground potential. On the other hand, a corresponding one of the NMOS transistors Q1 and Q2 functions to pull up the above-mentioned one of the bit lines BL and $\overline{BL}$ toward the power supply voltage Vcc. A readout data voltage developed between the data buses DB and $\overline{DB}$ is determined on the basis of the balance between the driving ability of the sense amplifier SA and the current supply ability of the NMOS transistors Q1 and Q2. Normally, the readout data voltage is approximately equal to 500 mV. The readout data voltage is limited to such a small voltage due to the fact that if data specified by the next address is opposite to that specified by the current address, the time necessary to reverse the data bus voltage becomes shorter as the readout data voltage becomes smaller.

Since the readout data voltage developed between the data buses DB and $\overline{DB}$ is made small, it is necessary to use an amplifier having a large voltage amplification (transconductance) ratio in order to amplify the readout data voltage. As is well known, a MOS transistor has a mutual conductance lower than that of a bipolar transistor, and does not have a large transfer ratio. However, a MOS differential circuit using a current mirror circuit functioning as a load is capable of providing a relatively high gain.

The data bus amplifier 2 is composed of p-channel MOS transistors (hereafter simply referred to as PMOS transistors) Q7, Q8, Q9 and Q10, and NMOS transistors Q3, Q4, Q5, Q6 and Q11. The PMOS transistors Q7 and Q8 form a current mirror circuit, and the PMOS transistors Q9 and Q10 form a current mirror circuit. The NMOS transistors Q3 and Q4, which are voltage amplification drive transistors, form a differential amplifier circuit to which a load consisting of the current mirror PMOS transistors Q7 and Q8 is connected. Similarly, the NMOS transistors Q5 and Q6, which are also voltage amplification drive transistors, form a differential amplifier circuit to which a load consisting of the current mirror PMOS transistors Q9 and Q10 is connected. The two pairs of the differential amplifier circuits connected in parallel form are provided to obtain differential output signals OUT1 and OUT2 from the drains of the NMOS transistors Q4 and Q5, respectively. As the transistor pairs Q3 and Q4 form the differential amplifier circuit, and the transistor pair Q5 and Q6 form the differential amplifier circuit, it is possible to obtain complementary output signals by means of a single differential amplifier circuit. However, such complementary output signals do not have good symmetry because the NMOS transistors Q3 and Q6 which respectively extract the gate voltages of the current mirror circuits have small amplitudes and generate deteriorated output signals, as compared with the NMOS transistors Q4 and Q5. The output signals OUT1 and OUT2 are drawn from the opposite sides of the two differential amplifier circuits. The NMOS transistor Q11 is provided for preventing a current from passing through the data bus amplifier 2 during a time the data bus amplifier 2 is not generating the output signals OUT1 and OUT2. When a clock $\phi_{EN}$ is maintained at a high level, the NMOS transistor Q11 allows the NMOS transistors Q3-Q6 to operate. On the other hand, when the clock $\phi_{EN}$ is maintained at a low level, the NMOS transistors Q3-Q6 are disconnected from the ground which functions as a low-potential power supply voltage.

It will be noted that C1 and C2 are parasitic capacitors coupled to the output side of the amplifier circuit, and Qa and Qb are NMOS transistors for use in column select. A column select signal Y is applied to the gates of the NMOS transistors Qa and Qb. A one-transistor one-capacitor type memory cell MC is connected to one of the bit lines (bit line BL in FIG. 1), and selected through a word line WL.

As has been described above, the conventional current mirror load type amplifier shown in FIG. 1 has a limited readout data voltage approximately equal to 500 mV, and is thus designed to pass large amounts of currents (equal to approximately 100 $\mu$A–200 $\mu$A) through the NMOS transistors Q3–Q6, so that they are used in a state where increased mutual conductances gm thereof are obtained. Thus, the conventional amplifier consumes a large amount of power. In addition, when a large number of amplifiers are simultaneously driven in parallel form, a large amount of IR drop occurs at the Vcc power supply line and ground line.

The PMOS transistors Q1 and Q2 function to limit the readout data voltage, and thus waste currents passing through these PMOS transistors Q1 and Q2. The NMOS transistors Q3–Q6 function as voltage amplifiers (voltage inputs and voltage outputs) which amplify the limited readout data voltage, and are thus required to have large mutual conductances gm. However, MOS transistors are not inherently optimal elements which satisfy the above-mentioned requirement.

SUMMARY OF THE INVENTION

It is a general object of the present invention to provide a novel and useful signal amplifier circuit for a pair of complementary signal lines, such as data buses, in which the above-mentioned disadvantages are eliminated.

A more specific object of the present invention is to provide a high gain and low power consumption signal amplifier circuit.

The above-mentioned objects of the present invention are achieved by a signal amplifier circuit comprising: first current mirror circuit means for outputting a first current to a first signal line and for outputting a second mirror current; second current mirror circuit means for outputting a third current to a second signal line and for outputting a fourth mirror current, the first and second signal lines forming a pair of complementary signal lines; and third current mirror circuit means for receiving the second and fourth mirror currents and for outputting an output signal based on a potential difference between the first and second signal lines.

The above-mentioned objects of the present invention are also achieved by a signal amplifier circuit comprising: first current mirror circuit means for outputting a first current to a first signal line and for outputting second and third mirror currents; second current mirror circuit means for outputting a fourth current to a second signal line and for outputting fifth and sixth mirror currents, said first and second signal lines forming a pair of complementary signal lines; third current mirror circuit means for receiving the second and fifth mirror currents and for outputting a first output signal; and fourth current mirror circuit means for receiving the third and sixth mirror currents and for outputting a second output signal complementary to the first output signal.

The present invention also provides a semiconductor memory device having the above-mentioned signal amplifier circuit.

BRIEF DESCRIPTION OF THE DRAWINGS

Other objects, features and advantages of the present invention will become more apparent from the following detailed description when read in conjunction with the accompanying drawings, in which:

FIG. 2A is a circuit diagram of a data bus signal amplifier circuit according to a first preferred embodiment of the present invention;

FIG. 2B is a circuit diagram of a variation of the amplifier circuit shown in FIG. 2A;

DESCRIPTION OF THE PREFERRED EMBODIMENTS

Figure 1:
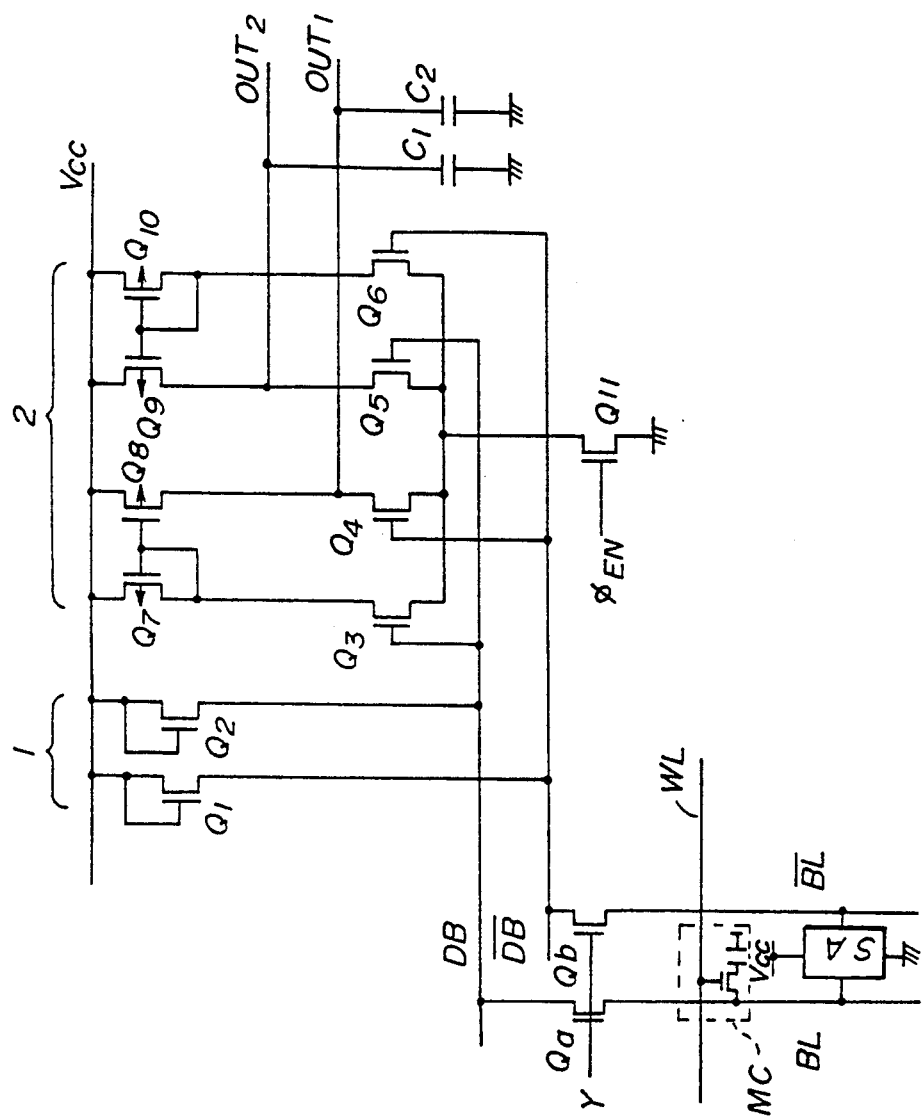
FIG. 1 is a circuit diagram of a conventional data bus signal amplifier circuit.

A description will now be given of a data bus signal amplifier circuit according to a first preferred embodiment of the present invention with reference to FIG. 2A, in which those parts which are the same as those shown in FIG. 1 are given the same reference numerals.

The amplifier circuit shown in FIG. 2A includes a first current mirror circuit 11, a second current mirror circuit 12 and a third current mirror circuit 13. The first current mirror circuit 11 is connected to the data bus DB, and the second current mirror circuit 12 is connected to the data bus $\overline{DB}$. The third current mirror circuit 1 is connected to the first and second current mirror circuits 11 and 12, respectively. The first current mirror circuit 11 is composed of PMOS transistors Q21 and Q22. The sources of the PMOS transistors Q21 and Q22 are connected to the Vcc power supply line, and the gates thereof are mutually connected and also connected to the data bus DB. The second current mirror circuit 12 is composed of PMOS transistors Q24 and Q25, the sources of which are connected to the Vcc power supply line. The gates of the PMOS transistors Q24 and Q25, which are mutually connected, are connected to the data bus $\overline{DB}$. The third current mirror circuit 13 is composed of NMOS transistors Q23 and Q26. The drain of the NMOS transistor Q23 is connected to the drain of the PMOS transistor Q22, and the source of the NMOS transistor Q23 is grounded. The drain of the NMOS transistor Q23 is also connected to an input terminal of a CMOS buffer 14 of a next stage circuit. The CMOS buffer 14 consists of a PMOS transistor Qi and an NMOS transistor Qj.

The data buses DB and $\overline{DB}$ are coupled to the bit lines BL and $\overline{BL}$ through the column select transistors Qa and Qb, respectively. As shown in FIG. 2A, the sense amplifier SA connected to the bit lines BL and $\overline{BL}$ are made up of PMOS transistors Qc, Qd and Qe, and NMOS transistors Qf, Qg and Qh. The PMOS transistor Qe is controlled by a pulse $\phi$s and the NMOS transistor Qh is controlled by a pulse $\phi$s. Each memory cell MC is composed of an NMOS transistor Qs and a capacitor Cs. A voltage Vpc is applied to the capacitor Cs. C1 denotes a parasitic capacitor on the output side of the data bus signal amplifier circuit, and C3 and C4 are parasitic capacitors on the data bus side.

The data bus signal amplifier circuit shown in FIG. 2A is a current-input voltage-output type amplifier. Before the sense amplifier SA is activated, the PMOS transistor Qe and the NMOS transistor Qh are OFF. Thus, no currents pass through the data buses DB and $\overline{DB}$. Assuming now that data "1" is read out from the memory cell MC, the NMOS transistor Qg starts to turn toward ON, and similarly, the PMOS transistor Qc starts to turn toward ON. Thus, the potential of the bit line $\overline{BL}$ starts to decrease, and the potential of the bit line BL starts to increase. Such potential changes in the bit lines BL and $\overline{BL}$ are transferred to the data buses DB and $\overline{DB}$ through the column select transistors Qa and Qb, respectively.

A current I starts to pass through the PMOS transistor Q21, the column select transistor Qb, and the NMOS transistors Qg and Qh. On the other hand, the potential of the data bus DB increases towards the power supply voltage Vcc, so that the PMOS transistor Q25 is OFF and thus the PMOS transistor Q24 is also OFF. That is, no current passes through the PMOS transistors Q24 and Q25. Even if a current passes through the PMOS transistor Q25, it is instantaneously generated before the potential of the data bus $\overline{DB}$ has become a voltage nearly equal to the power supply voltage Vcc. Since the PMOS transistors Q24 and Q25 are OFF, the NMOS transistor Q26 is OFF and thus NMOS transistor Q23 is OFF. Since the NMOS transistor Q23 is OFF, a current kI passes through the PMOS transistor Q22 where k is the ratio of the mutual conductance gm of the PMOS transistor Q22 to that of the PMOS transistor Q21. When k=1, a current equal to the current I passing through the PMOS transistor Q21 passes through the PMOS transistor Q22. The current kI passing through the PMOS transistor Q22 passes through the parasitic capacitor C1, and finally becomes zero. Thus, the circuit shown in FIG. 2A consumes an extremely small amount of power. On the other hand, even when the transistor Q4 of the conventional amplifier circuit is OFF, the through current passes from the Vcc power supply line to the ground through the transistors Q7, Q3 and Q11. Thus, a large amount of power is consumed in the conventional amplifier circuit shown in FIG. 1.

The current kI charges the parasitic capacitor C1. After the parasitic capacitor C1 has been completely charged, no current passes through the PMOS transistor Q22. The current I drives the data bus DB, and the current kI equal to or k times the current I charges the parasitic capacitor C1. On the other hand, the parasitic capacitors C3 and C4 have a capacitance much greater than the parasitic capacitor C1. Thus, the drain voltage of the PMOS transistor Q22 changes much faster than that in the data bus DB. For example, assuming that the parasitic capacitor C4 coupled to the data bus DB is 1 pF, the parasitic capacitor C1 is approximately equal to 0.07 pF in a case where a gate oxidation film of the next stage, that is, each of the transistors Qi and Qj, is 10 nm thick, and the gate size is 1 $\mu m \times 20$ $\mu m$. Thus, C4/C1=14.3, and a change in the drain voltage of the PMOS transistor Q22 is 14.3 k times faster than a change in the data bus DB. It will be noted that although no current is amplified for k=1, a voltage gain can be obtained when the parasitic capacitance on the data bus side is greater than that on the output side.

On the other hand, when the bit line BL is pulled down toward the ground potential and the bit line $\overline{BL}$ is pulled up toward the power supply voltage Vcc, the current I passes through the data bus $\overline{DB}$, and no current passes through the data bus DB. Thus, no current is supplied to the output buffer 14. Thus, a voltage nearly equal to the power supply voltage Vcc appears at the output terminal OUT.

It will be seen from the above description that there is no current which permanently passes from the power supply voltage Vcc to the ground. In other words, all the current output from the current mirror circuit 11 or 12 is supplied to the CMOS buffer 14. Thus, the amplifier shown in FIG. 2A consumes an extremely reduced amount of power.

FIG. 2B shows a variation of the third current mirror circuit 13. The gates of the NMOS transistors Q23 and Q26 are connected to the drain of the PMOS transistor Q22, and the output signal is extracted from the drain of the NMOS transistor Q26. It is possible to use the variation shown in FIG. 2B instead of the configuration shown in FIG. 2A.

As will be described in detail later, the first and second current mirror circuits 11 and 12 are formed of bipolar transistors, or Darlington amplifier circuits. The third current mirror circuit 13 is also formed of these alternative elements.

A description will now be given of a data bus signal amplifier circuit according to a second preferred embodiment of the present invention with reference to FIG. 3, in which those parts which are the same as those shown in FIG. 2A are given the same reference numerals. It will be noted that the sense amplifier SA shown in FIG. 2A is omitted in FIG. 3 for the sake of simplicity.

Figure 3:
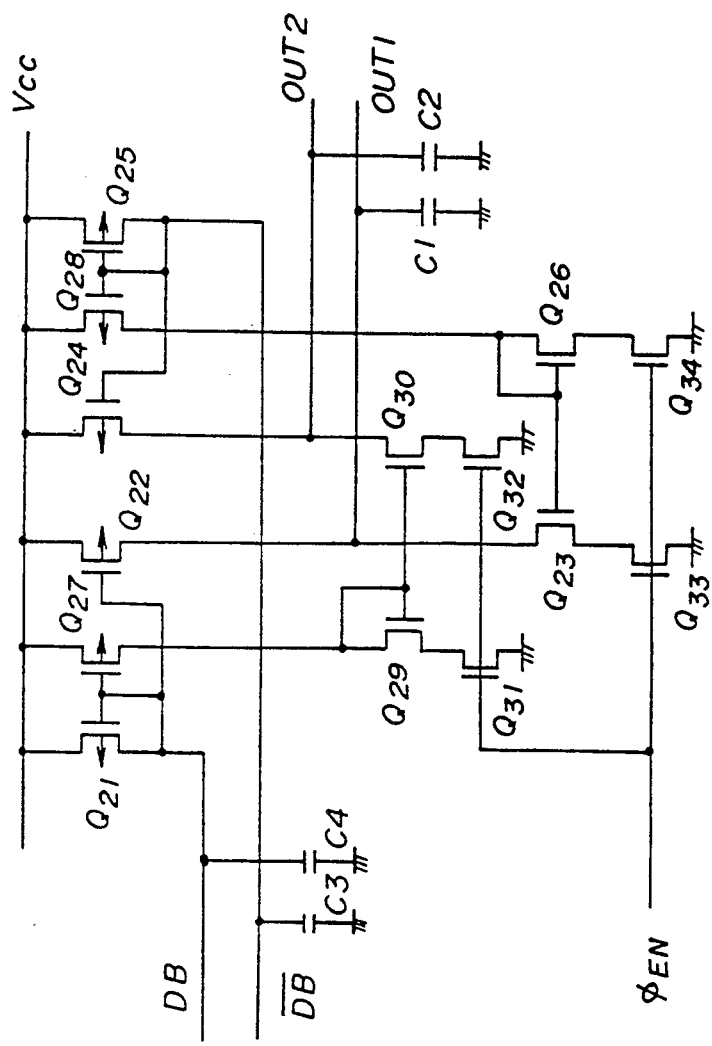
FIG. 3 is a circuit diagram of a data bus signal amplifier circuit according to a second preferred embodiment of the present invention.

The data bus signal amplifier circuit shown in FIG. 2A is a single end type amplifier circuit, while the data bus signal amplifier circuit shown in FIG. 3 is a differential output type amplifier circuit. The circuit shown in FIG. 3 is formed by adding two PMOS transistors Q27 and Q28, and six NMOS transistors Q29–Q34 to the configuration shown in FIG. 2A. The PMOS transistor Q21 forms not only the current mirror amplifier together with the PMOS transistor Q22 but also a current mirror amplifier together with the PMOS transistor Q27. Thus, currents proportional to the current passing through the PMOS transistor Q21 and the data bus DB pass through the PMOS transistors Q22 and Q27. Similarly, the PMOS transistor Q25 forms not only the current mirror amplifier together with the PMOS transistor Q24 but also a current mirror amplifier together with the PMOS transistor Q28. Thus, currents proportional to the current passing through the PMOS transistor Q25 and the data bus $\overline{DB}$ pass through the PMOS transistors Q24 and Q28. Since the currents passing through the PMOS transistors Q27 and Q28 are proportional to the currents passing through the PMOS transistors Q21 and Q25, respectively, there is a differential relationship between the currents passing through the PMOS transistors Q27 and Q28. Similarly, there is a differential relationship between the currents passing through the PMOS transistors Q22 and Q24. The currents from the PMOS transistors Q27 and Q24 are respectively received by the NMOS amplifiers Q29 and Q30 of the current mirror circuit. The output signal OUT2 is drawn from the drain of the NMOS transistor Q30. On the other hands, the currents from the PMOS transistors Q22 and Q28 are respectively received by the NMOS transistors Q23 and Q26 of the current mirror circuit. The output signal OUT1 is drawn from the drain of the NMOS transistors Q23.

The NMOS transistors Q31, Q32, Q33 and Q34 are provided for turning ON/OFF the current paths which include NMOS transistors Q29, Q30, Q23 and Q26, respectively. When it is not required that the data bus signal amplifier circuit amplifies the readout data voltage developed between the data buses DB and $\overline{DB}$, the clock $\phi_{EN}$ maintained at the low level is applied to the gates of the NMOS transistors Q31–Q34.

Figure 4A:
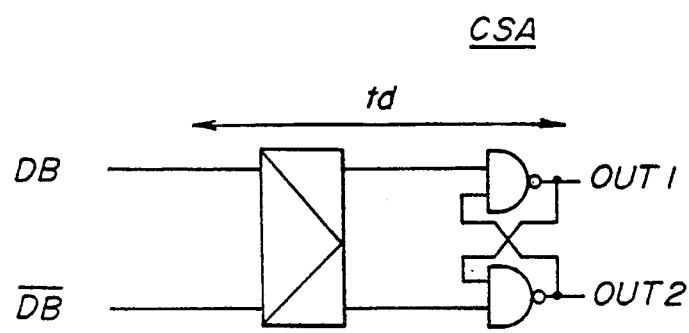
FIGS. 4A and 4B are block diagrams of a data bus signal amplifier circuit according to the present invention and a conventional data bus signal amplifier circuit, both of which are used in experiments.
Figure 4B:
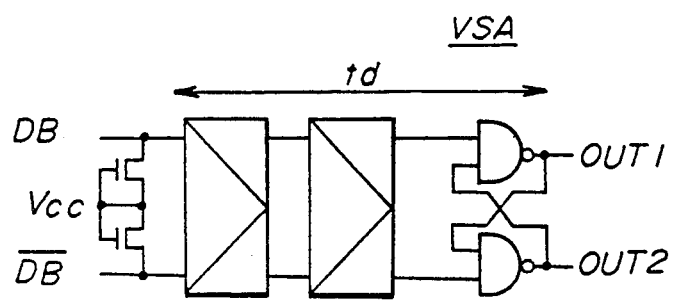

FIG. 4A is a block diagram of an experimental amplifier circuit CSA (Current sensing amplifier) according to the present invention used in the experiments. The block shown in FIG. 4A corresponds to the circuit shown in FIG. 3, and is followed by an RS flip-flop. FIG. 4B is a block diagram of an amplifier (Voltage Sensing Amplifier) which is based on the conventional amplifier circuit shown in FIG. 1 and which is used in the experiments. Two series-connected blocks are respectively amplifiers, each of which includes the data bus amplifier 2 shown in FIG. 1. It should be noted that generally, two data bus amplifiers 2 connected in series are used to obtain a desired gain. The amplifier of the second stage is followed by the RS flip-flop.

Figure 5A:
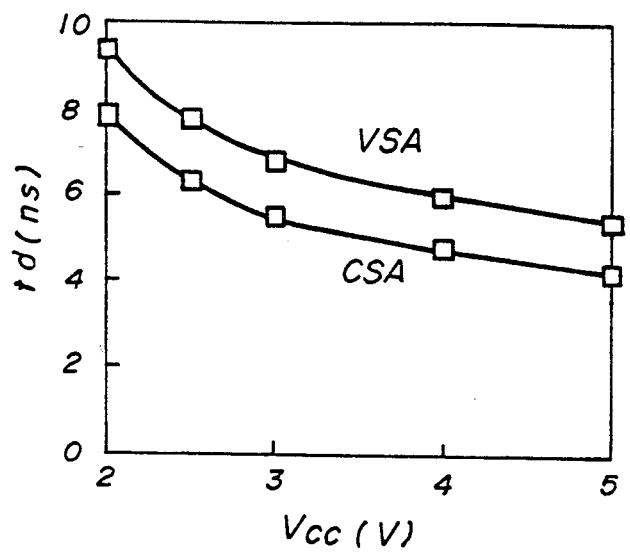
FIGS. 5A and 5B are graphs showing the results of the experiments.

FIG. 5A is a graph showing a delay time (ns) between the data bus side and the output side of the RS flip-flop obtained at different values of the power supply voltage Vcc for the same input condition. It can be seen from FIG. 5A that the amplifier circuit CSA according to the present invention can operate more rapidly than the conventional amplifier VSA.

Figure 5B:
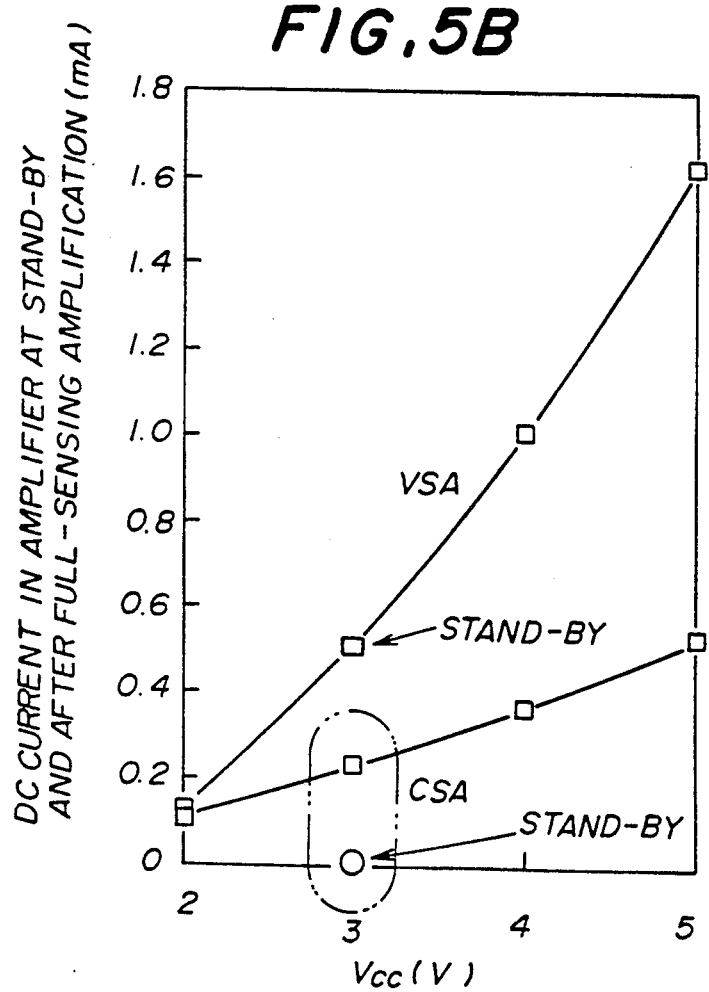

FIG. 5B is a graph showing the amounts of currents consumed in the amplifiers CSA and VSA in a stand-by mode where no current passes through the data buses DB and $\overline{DB}$, and a full-sensing amplification mode. It can be seen from the graph of FIG. 5B that no D.C. stand-by power is consumed in the amplifier CSA. On the other hand, some D.C. stand-by power is consumed in the conventional amplifier VSA. This is due to the fact that the PMOS transistors Q1 and Q2 are ON in the stand-by mode and thus the gate-source voltage (D.C. bias voltage) of each of the NMOS transistors Q3–Q6 coupled to the data buses DB and $\overline{DB}$ is large as compared with the potentials of the data buses DB and $\overline{DB}$. On the other hand, the bias voltage of the PMOS transistor Q22 coupled to the data bus DB is close to the threshold voltage thereof.

A description will now be given of a DRAM device according to a third preferred embodiment of the present invention with reference to FIG. 6. The DRAM device comprises a memory cell array 31, a sense amplifier 32, a write gate 33, a read gate 34, a row decoder 35, a column decoder 36, a write amplifier 37, a clock generator 38, an RS flip-flop 39, a latch circuit (output buffer) 40, an inverter 41, a timing generator 42 and a data bus signal amplifier circuit 100. The row decoder 35 decodes an external address signal supplied from an external circuit (not shown) and selects at least one of the word lines WL. For the sake of simplicity, only one word line WL is illustrated. On the other hand, the column decoder 36 decodes the external address signal and selects at least one of the pairs of bit lines BL and $\overline{BL}$. For the sake of simplicity, only one pair of bit lines BL and $\overline{BL}$ is illustrated. The sense amplifier 32, which has the same configuration as that of the sense amplifier SA shown in FIG. 2A, senses a potential difference between the bit lines BL and $\overline{BL}$. Then, the sense amplifier 32 pulls up one of the bit lines BL and $\overline{BL}$ toward the power supply voltage Vcc and pulls down the other bit line toward the ground potential.

The read gate 34 is composed of NMOS transistors 34a, 34b, 34c and 34d. The gates of the NMOS transistors 34c and 34d are connected to a column select line CL extending from the column decoder 36. As will be described later, the NMOS transistors 34c and 34d are turned ON during a predetermined period in response to a column select signal via the column select line CL. The drains of the NMOS transistors 34a and 34b are connected to the data buses $\overline{DB}$ and DB, and the sources thereof are connected to the drains of the NMOS transistors 34c and 34d, respectively. The sources of the NMOS transistors 34c and 34d are grounded.

The data bus signal amplifier circuit 100 is almost the same as that shown in FIG. 3 except for the following. That is, PMOS transistors Q35 and Q36 are provided between the Vcc power supply line and the sources of the PMOS transistors Q21 and Q25. A clock signal $\phi_{EN1}$ from the inverter 41 is applied to the gates of the PMOS transistors Q35 and Q36. PMOS transistors Q64 and Q65 are provided to stabilize the potentials of the output lines OUT1 and OUT2 during the reset operation. The sources of the PMOS transistors Q64 and Q65 are connected to the Vcc power supply line, and the drains thereof are connected to the output lines OUT1 and OUT2, respectively. The clock signal $\phi_{EN2}$ is applied to the gates of the PMOS transistors Q64 and Q65. The two complementary output signals of the amplifier circuit 100 are received by the RS flip-flop 39, and then latched by the latch circuit 40, which outputs readout data Dout.

The write amplifier 37 receives write input data Din, and controls the write gate 33, which is composed of NMOS transistors 33a and 33b. That is, the write gate 33 drives the bit lines BL and $\overline{BL}$ in accordance with the write data Din. The clock generator 38 receives a write enable signal $\overline{WE}$ from an external circuit, and generates a clock signal $\phi_{EN2}$, which is 180° out of phase with the aforementioned clock signal $\phi_{EN1}$. The clock signal $\phi_{EN2}$ is applied to the gates of the NMOS transistors Q31–Q34. The timing generator 42 receives a row address strobe signal $\overline{RAS}$ and a column address strobe signals $\overline{CAS}$ from an external device, and generates various timing (clock) signals, which are supplied to the sense amplifier 32, the row decoder 35, the column decoder 36, and so on.

A description will now be given of the operation of the DRAM device shown in FIG. 6 with reference to FIG. 7. The operation illustrated in FIG. 7 is based on a read modified write mode. The row address strobe signal $\overline{RAS}$ falls, and the semiconductor memory device inputs, as a row address, an external address applied to address input pins (not shown) at this time. Due to the function of the row decoder 35, the word line WL is selected. The potential of the word line WL starts to rise at time $t_1$.

On the other hand, when a predetermined time has elapsed after the row address strobe signal $\overline{RAS}$ falls, the external address applied to the address input pins is handled to be a column address due to the function of a timer circuit (not shown) which counts the above predetermined time. In this way, the column address is input to the column decoder 36, which drives the column select line CL related to the column address at time $t_2$. Thereby, the column select transistors 34c and 34d are allowed to conduct. At this time, the potentials of the data buses DB and $\overline{DB}$ fall instantaneously because the bit lines BL and $\overline{BL}$ are conducting due to the memory cell output on the bit lines BL and $\overline{BL}$. That is, currents pass through the data buses DB and $\overline{DB}$.

The signal amplifier circuit 100 functions to amplify the difference between the input currents. Even when currents pass through both the data buses DB and $\overline{DB}$, the output voltages OUT1 and OUT2 change if there is a difference between the two currents. In the operation shown in FIG. 7, the potential of the data bus DB falls more than the potential of the data bus $\overline{DB}$. This is due to the fact that binary data "0" is being read out, that is, the internal resistance of the NMOS transistor 34b is smaller than the NMOS transistor 34a. In other words, the gate voltage of the NMOS transistor 34b is higher than that of the NMOS transistor 34a.

At time t3, the sense amplifier 32 is driven. Then, the potential of the bit line BL goes toward the ground potential, and the bit line $\overline{BL}$ goes toward the Vcc level. When the potential of the bit line BL becomes equal to or lower than that of the threshold voltage of the NMOS transistor 34a, the transistor 34a is cut off, and no current passes through the data bus $\overline{DB}$. Thus, from t3, the potential of the data bus $\overline{DB}$ is restored to the original level Vcc - Vth(p) where Vth(p) is the threshold voltage of the PMOS transistor.

At time t4, the column select transistors 34c and 34d are turned OFF. The current is permitted from passing through the data bus DB, so that the potential of the data bus DB increases toward Vcc - Vth(p).

The data bus signal amplifier 100 controls its output currents on the basis of the differences between the currents passing through the data buses DB and $\overline{DB}$. The output currents of the data bus signal amplifier 100 are not affected by in-phase currents on the input side thereof. However, currents pass through all the transistors in the data bus signal amplifier 100 when in-phase currents flow. The gain of MOS transistor is larger in the state where current passes through the MOS transistor to some extent. As a result, the arrangement in which currents pass through the data buses DB and $\overline{DB}$ during the initial stage of the operation makes the amplifier 100 to operate at a higher speed.

After that, the write enable signal $\overline{WE}$ becomes active. In response to the above change, the clocks $\phi_{EN1}$ and $\phi_{EN2}$ are respectively reversed, so that the data bus signal amplifier circuit 100 is made inactive. In response to the change in the write enable signal $\overline{WE}$, the write amplifier 37 controls the bit lines BL and $\overline{BL}$ in accordance to the received input data Din through the write gate 33. After that, the write enable amplifier $\overline{WE}$ becomes inactive. At the same time, the row address strobe signal $\overline{RAS}$ and the column address strobe signal $\overline{CAS}$ become inactive. After that, the selected word line WL is released from the selected state, and the sense amplifier 32 is made inactive.

The DRAM device having the data bus signal amplifier circuit 100 according to the present invention operates at a higher speed and consumes a smaller amount of power than the conventional DRAM. In addition, this DRAM device has a smaller size than that of the conventional art because the structure of the data bus signal amplifier circuit 100 is simpler than that of the conventional art. Further, the use of the read gate 34 contributes to a reduction in the size of the sense amplifier 32. The read gate 34 shown in FIG. 6 does not connect the bit lines BL and $\overline{BL}$ to the data buses DB and $\overline{DB}$ directly. This configuration of the read gate 34 is different from that of the gate including the NMOS transistors Qa and Qb shown in FIG. 2A. That is, it is not necessary for the sense amplifier 32 shown in FIG. 6 to drive the data buses DB and $\overline{DB}$. In other words, the sense amplifier 32 controls only the NMOS transistors 34c and 34d of the read gate 34. Thus, it is possible to form the sense amplifier 32 of smaller-size NMOS transistors.

Figure 6:
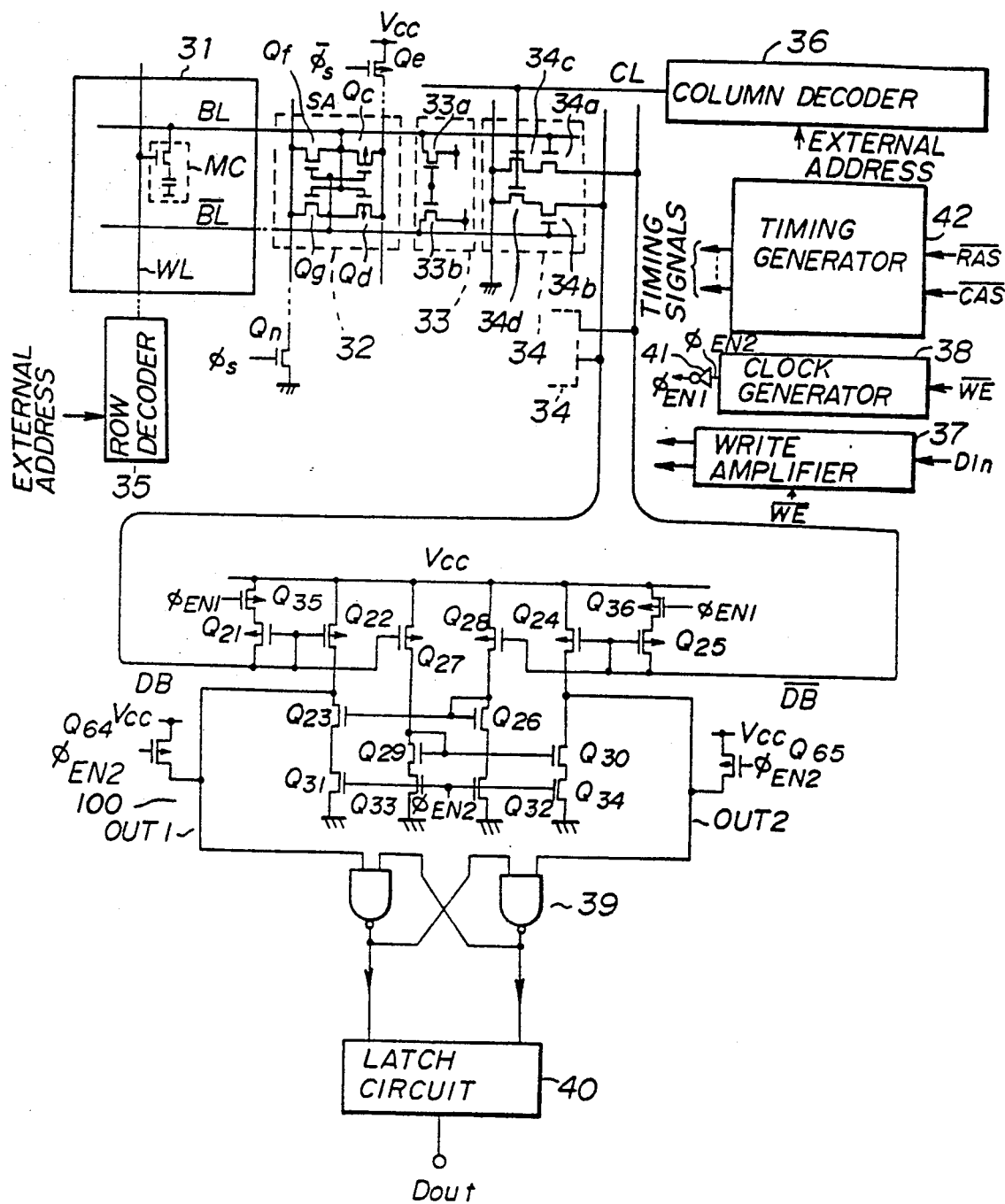
FIG. 6 is a circuit diagram of a DRAM device according to a third preferred embodiment of the present invention.
Figure 7:
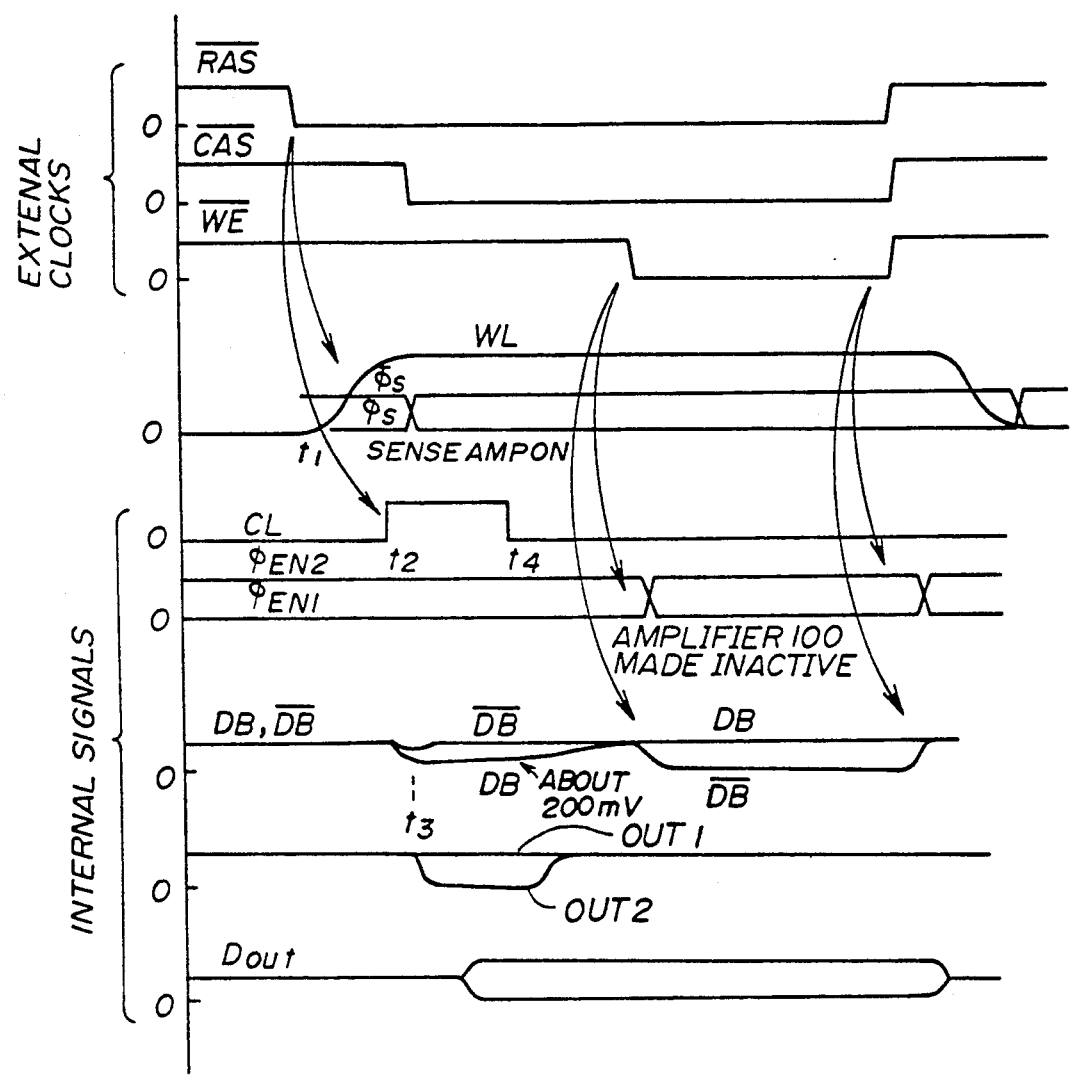
FIG. 7 is a waveform diagram illustrating the operation of the DRAM device shown in FIG. 6.
Figure 8:
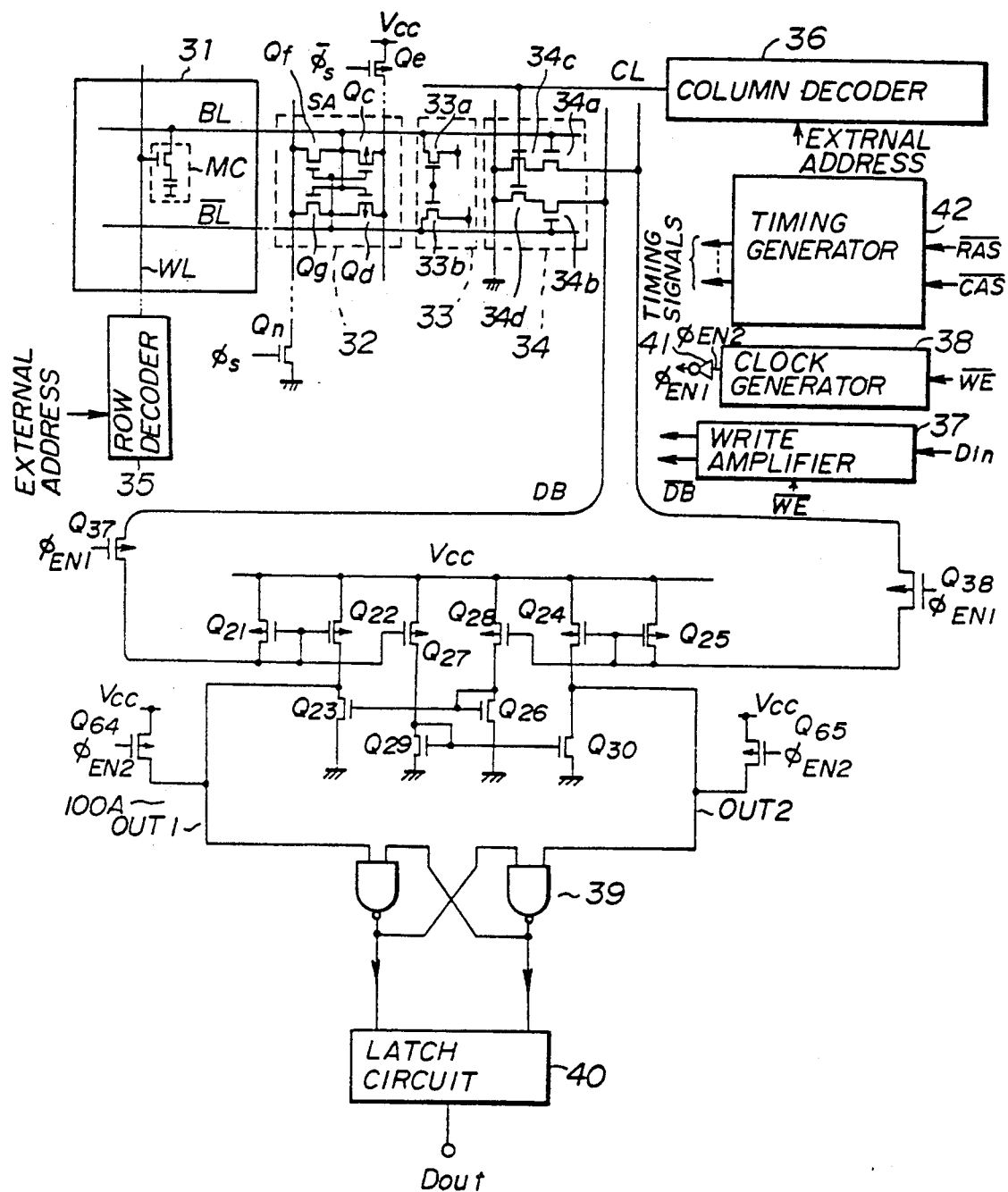
FIG. 8 is a circuit diagram of a first variation of the DRAM device shown in FIG. 6.

FIG. 8 shows a first variation of the DRAM device shown in FIG. 6. In FIG. 8, those parts which are the same as those shown in FIG. 6 are given the same reference numerals. A data bus signal amplifier circuit 100A is substituted for the data bus signal amplifier circuit 100 shown in FIG. 6. The amplifier circuit 100A is obtained for omitting the PMOS transistors Q35 and Q36, and the NMOS transistors Q31–Q34. The amplifying operation of the amplifier circuit 100A is the same as that of the amplifier circuit 100. Two PMOS transistors Q37 and Q38 are provided in place of the omitted transistors. The PMOS transistor 37 is provided in the data bus DB, and the PMOS transistor 38 is provided in the data bus $\overline{DB}$. The gates of the PMOS transistors 37 and 38 are respectively supplied with the clock $\phi_{EN1}$. During the time the write enable signal $\overline{WE}$ is maintained in the active state, the clock $\phi_{EN1}$ maintained at the high level is applied to the gates of the PMOS transistors Q37 and Q38, so that the amplifier circuit 100A is disconnected from the data buses DB and $\overline{DB}$. The configuration shown in FIG. 8 is simpler than that shown in FIG. 6.

Figure 9:
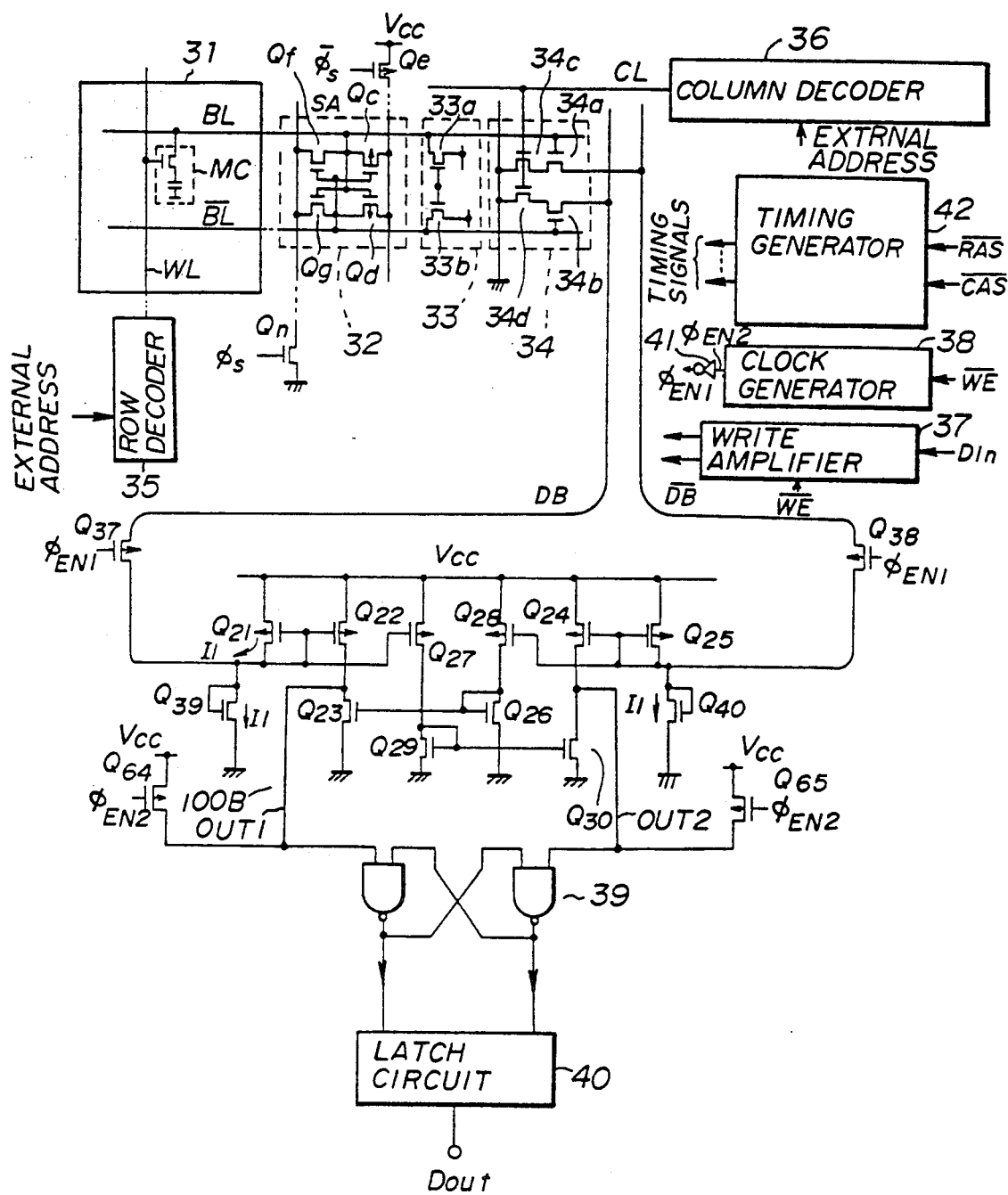
FIG. 9 is a circuit diagram illustrating a second variation of the DRAM device shown in FIG. 6.

A description will now be given of a second variation of the DRAM device shown in FIG. 6 with respect to FIG. 9, in which those parts which are the same as those shown in FIGS. 6 and 8 are given the same reference numerals. The DRAM device shown in FIG. 9 is obtained by adding two NMOS transistors Q39 and Q40 to the configuration shown in FIG. 8. The drain and gate of the NMOS transistor Q39 are connected to the data bus DB, and the drain and gate of the NMOS transistor Q40 are connected to the data bus $\overline{DB}$.

Figure 10A:
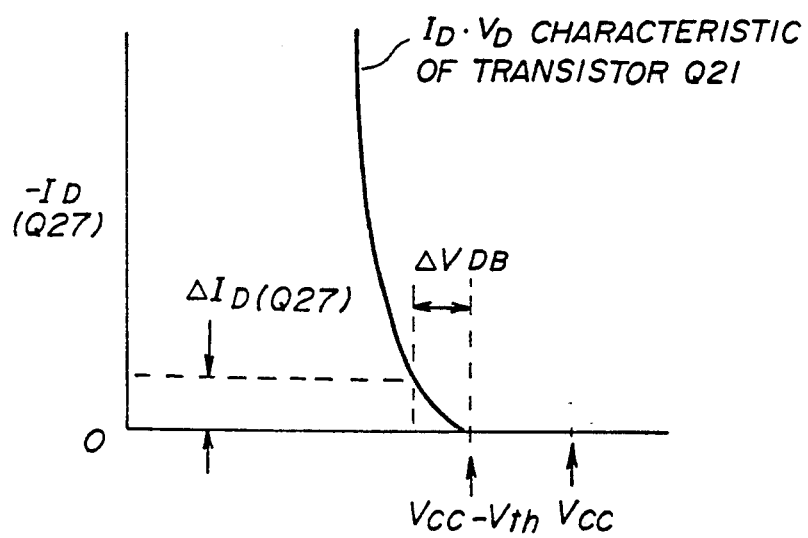
FIG. 10A is a graph of an $I_D$-$V_D$ characteristic of transistor Q21 shown in FIG. 8.

FIG. 10A is a graph illustrating the drain current ($I_D$) vs. drain voltage ($V_D$) characteristic of the PMOS transistor Q21 in the DRAM device shown in FIG. 8. The bias point of the PMOS transistor Q21 is located at a potential equal to (Vcc - Vth(p)), where Vth(p) is the threshold voltage of the PMOS transistor Q21. When a readout data voltage $\Delta V_{DB}$ appears between the data buses DB and $\overline{DB}$, a current $\Delta I_D$ passes through the PMOS transistor Q27.

Figure 10B:
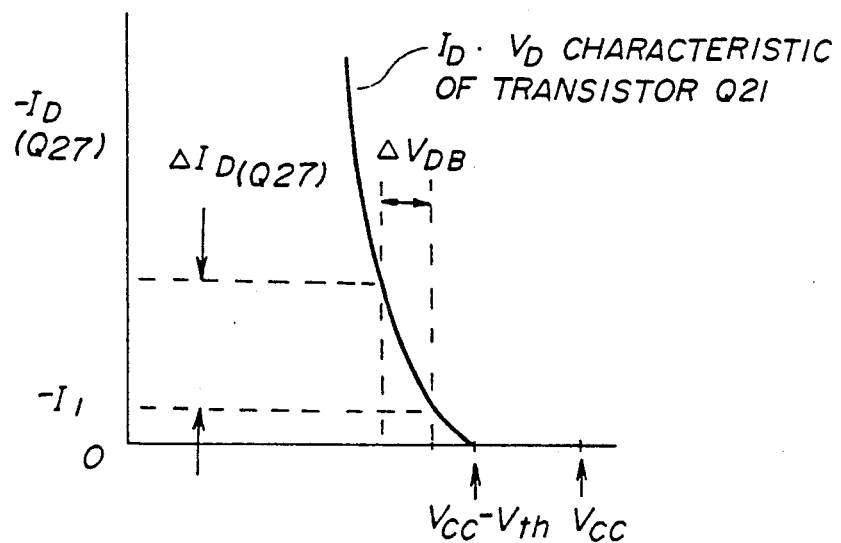
FIG. 10B is a graph of an $I_D$-$V_D$ characteristic of the same transistor shown in FIG. 9.

FIG. 10B is a graph illustrating the drain current ($I_D$) vs. drain voltage ($V_D$) characteristic of the PMOS transistor Q21 in the DRAM device shown in FIG. 9. The bias point of the PMOS transistor Q21 is located at a potential lower than (Vcc - Vth) due to the function of the diode-connected NMOS transistor Q39. A current I1 always passes through the PMOS transistor Q21 and the NMOS transistor Q39 in the state where the PMOS transistor Q37 is OFF. It will be noted that this bias point is located at an abruptly rising portion of the $I_D$ vs. $V_D$ characteristic curve. When the same readout data voltage $\Delta V_{DB}$ between the data buses DB and $\overline{DB}$ appears, the current $\Delta I_D$ passes through the PMOS transistor Q21 and the NMOS transistor Q39. It can be seen from the graphs of FIGS. 10A and 10B that a change in the current $\Delta I_D$ obtained in the DRAM device shown in FIG. 9 is greater than that obtained in the DRAM device shown in FIG. 8. This means that the amplifier circuit 100A has a gain (driving ability) greater than that of the amplifier circuit 100 and operates at a higher speed.

A description will now be given of a data bus signal amplifier circuit according to a fourth preferred embodiment of the present invention with reference to FIG. 11, in which those parts which are the same as those shown in the previous figures are given the same reference numerals.

Figure 11:
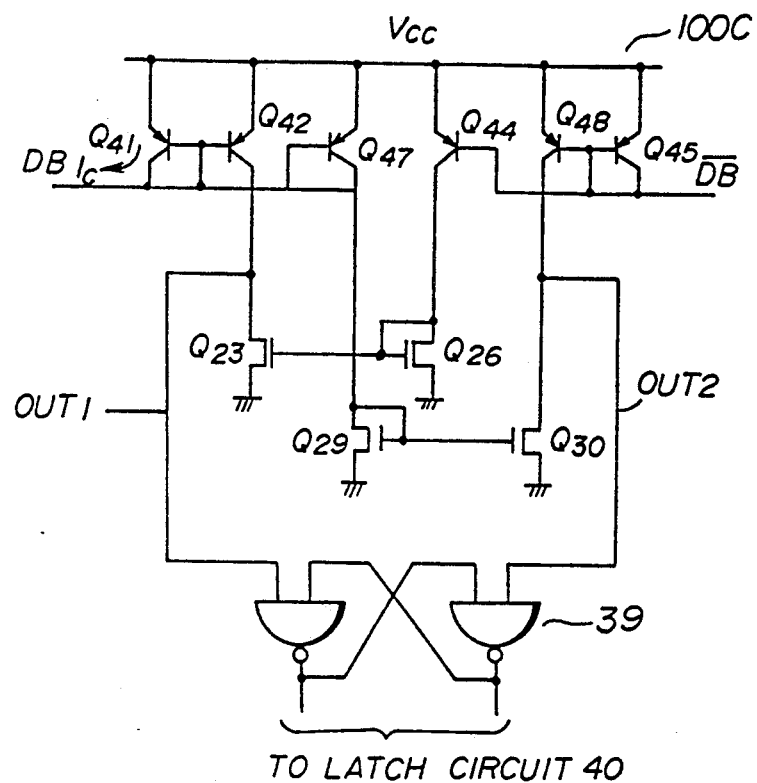
FIG. 11 is a circuit diagram of a data bus signal amplifier circuit according to a fourth preferred embodiment of the present invention.

A data bus signal amplifier circuit 100C shown in FIG. 11 has pnp bipolar transistors Q41, Q42, Q44, Q45, Q47 and Q48, which are substituted for the PMOS transistors Q21, Q22, Q24, Q25, Q27 and Q28 used in the aforementioned embodiments. The respective emitters of these bipolar transistors are connected to the Vcc power supply line. The base and collector of the bipolar transistor Q41 are connected to the data bus DB. The bases of the bipolar transistors Q42 and Q47 are connected to the data bus DB. The collector of the bipolar transistor Q47 is connected to the drain of the NMOS transistor Q29, and the collector of the bipolar transistor Q42 is connected to the drain of the NMOS transistor Q23. The bipolar transistors Q44, Q45 and Q48 are connected in the same way as the transistors Q41, Q42 and Q47.

Figure 12:
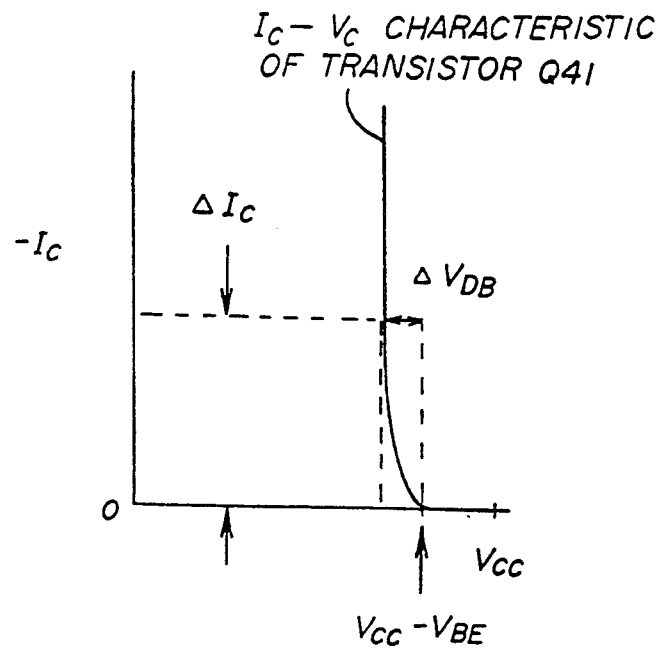
FIG. 12 is a graph of an Ic-Vc characteristic of transistor Q41 shown in FIG. 11.

FIG. 12 is a graph illustrating a collector current (Ic) vs. collector voltage (Vc) characteristic of the bipolar transistor Q41. It will be seen from the comparison between FIGS. 10A and 12 that the Ic-Vc characteristic curve is sharper than the $I_D$-$V_D$ characteristic curve. Thus, a change in the collector current Ic is greater than a change in the drain current $I_D$ for the same data readout voltage developed between the data buses DB and $\overline{DB}$. Hence, the amplifier circuit shown in FIG. 11 has a driving ability greater than the driving abilities of the amplifier circuits 100, 100A and 100B, and operates at a higher speed. The amplifier circuit 100C can be substituted for any of the amplifier circuits 100, 100A and 100B.

It can be seen from the above that the configuration shown in FIG. 3 can be formed of bipolar transistors. That is, the bipolar type data bus signal amplifier circuit can be formed by omitting the bipolar transistors Q47 and Q48 and the NMOS transistors Q29 and Q30. Similarly, the configuration shown in FIG. 2A can be formed of bipolar transistors.

Figure 13:
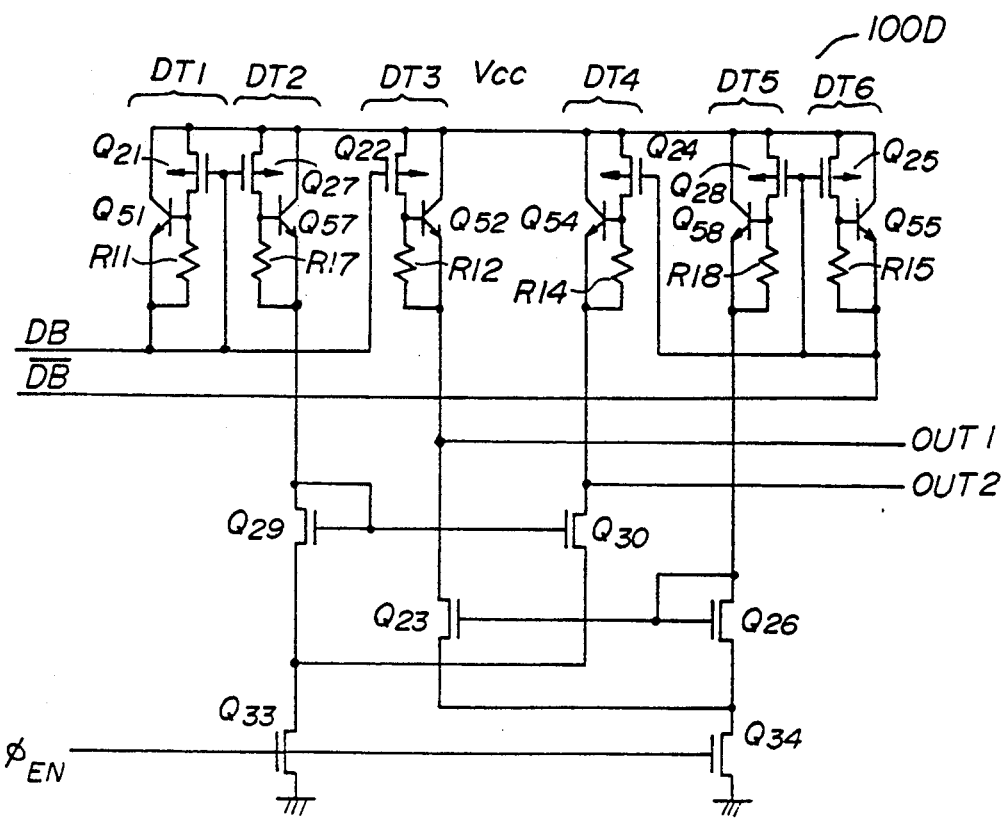
FIG. 13 is a circuit diagram of a data bus signal amplifier circuit according to a fifth preferred embodiment of the present invention.

A description will now be given of a data bus signal amplifier circuit according to a fifth preferred embodiment of the present invention with reference to FIG. 13, in which those parts which are the same as those shown in the previous figures are given the same reference numerals. A data bus signal amplifier circuit 100D has six Darlington amplifier circuits DT1-DT6. The Darlington amplifier circuit DT1 is formed of the PMOS transistor Q21, an npn bipolar transistor Q51 and a resistor R11. The drain of the PMOS transistor Q21 is connected to the base of the bipolar transistor Q51, the collector of which is connected to the Vcc power supply line. The resistor R11 is connected between the emitter and base of the bipolar transistor Q51. The emitter of the bipolar transistor Q51 is connected to the data bus DB. The drain current of the PMOS transistor Q21 is amplified by the bipolar transistor Q51 and output to the data bus DB.

Figure 14:
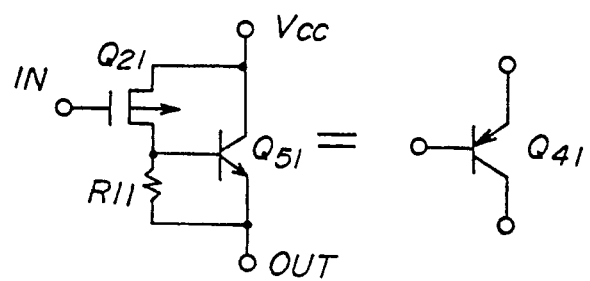
FIG. 14 is a circuit diagram showing a Darlington amplifier circuit used in the circuit shown in FIG. 13 which is equivalent to a pnp transistor.
Figure 15:
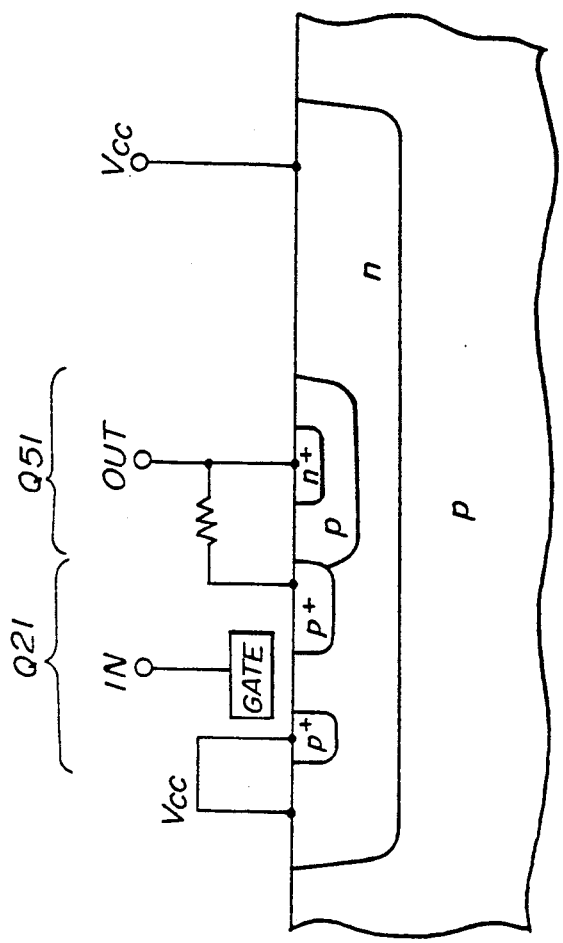
FIG. 15 is a cross-sectional view of the Darlington amplifier circuit shown in FIG. 14.

As shown in FIG. 14, the Darlington amplifier circuit DT1 is equivalent to the pnp transistor Q41 shown in FIG. 11. The Darlington amplifier circuit DT1 has a gain greater than that of the PMOS transistor Q21. Thus, use of the Darlington amplifier circuit DT1 makes it possible to use a sense amplifier having a smaller driving data bus ability, and contributes to an increase in the operating speed. FIG. 15 is a cross-sectional view of the Darlington amplifier circuit DT1 shown in FIG. 14.

The Darlington amplifier circuit DT2 is composed of the PMOS transistor Q27, a bipolar transistor Q57 and a resistor R17. The Darlington amplifier circuit DT3 is composed of the PMOS transistor Q22, a bipolar transistor Q52 and a resistor R12. The Darlington amplifier circuit DT4 is composed of the PMOS transistor Q24, a bipolar transistor Q54 and a resistor R14. The Darlington amplifier circuit DT5 is composed of the PMOS transistor Q28, a bipolar transistor Q58 and a resistor R18. The Darlington amplifier circuit DT6 is composed of the PMOS transistor Q25, a bipolar transistor Q55 and a resistor R15.

The Darlington amplifier circuit DT1 forms two current mirror circuits together with the Darlington amplifier circuits DT2 and DT3. The Darlington amplifier circuit DT6 forms two current mirror circuits together with the Darlington amplifier circuits DT4 and DT5.

The configuration shown in FIG. 3 can be formed of the Darlington amplifier circuits DT1, DT3, DT4 and DT6. Similarly, the configuration shown in FIG. 2A can be formed of Darlington amplifiers.

It should be noted that in the present specification, the term "data bus" can be understood so that it includes not only a narrow concept which indicates a long signal line extending from the memory cell array to the peripheral circuits and carrying a signal on the bit line, but also a wide concept which indicates a short signal line connecting the column select gate and the bit line difference voltage amplifier (sense amplifier).

The present invention is not limited to the specifically disclosed embodiments, and variations and modifications may be made without departing from the scope of the present invention.

What is claimed is:

1. A semiconductor memory device, comprising:
a memory cell array and a pair of data buses for transferring data with respect to the memory cell array;
a signal amplifier circuit which is connected to said pair of data buses corresponding to first and second signal lines and comprises first current mirror circuit means for outputting a first current to said first signal line and for outputting a second mirror current, second current mirror circuit means for outputting a third current to said second signal line and for outputting a fourth mirror current, and third current mirror circuit means for receiving said second and fourth mirror currents and for outputting an output signal based on a potential difference between said first and second signal lines, said first and second signal lines forming a pair of complementary signal lines;
write means for writing input data into selected memory cells; and
control means for making said signal amplifier circuit inactive during a time when said write means writes said input data into said selected memory cells.

2. The semiconductor memory device as claimed in claim 1, wherein:
said first current mirror circuit means comprises a first MIS transistor having a first terminal connectable to receive a first voltage, a gate and a second terminal connected to said gate and said first signal line, and a second MIS transistor having a first terminal connectable to receive said first voltage, a gate connected to the gate of said first MIS transistor, and a second terminal through which said second mirror current is output; and
said second current mirror circuit means comprises a third MIS transistor having a first terminal connectable to receive said first voltage, a gate connected to said second signal line, and a second terminal connected to said second signal line, and a fourth MIS transistor having a first terminal connectable to receive said first voltage, a gate connected to said second signal line, and a second terminal through which said fourth mirror current is output.

3. The semiconductor memory device as claimed in claim 2, wherein said third current mirror circuit means comprises:
  a fifth transistor having a first terminal connectable to receive a second voltage, a second terminal connectable to receive said second mirror current, and a control terminal connectable to receive said fourth mirror current; and
  a sixth transistor having a first terminal connectable to receive said second voltage, a second terminal connectable to receive said fourth mirror current, and a control terminal connected to the control terminal of said fifth transistor, said output signal being extracted from said second terminal of said fifth transistor.

4. The semiconductor memory device as claimed in claim 2, wherein said third current mirror circuit means comprises:
  a fifth transistor having a first terminal connectable to receive a second voltage, a second terminal connectable to receive said second mirror current, and a control terminal connectable to receive said second mirror current; and
  a sixth transistor having a first terminal connectable to receive said second voltage, a second terminal connectable to receive said fourth mirror current, and a control terminal connectable to receive said second mirror current, said output signal being extracted from said second terminal of said sixth transistor.

5. The semiconductor memory device as claimed in claim 2, wherein:
  said second MIS transistor has a mutual conductance equal to k times that of said first MIS transistor where k is a value equal to or larger than 1; and
  said fourth MIS transistor has a mutual conductance equal to k times that of said third MIS transistor.

6. The semiconductor memory device as claimed in claim 1, wherein:
  said first current mirror circuit means comprises a first bipolar transistor having an emitter connectable to receive a first voltage, a base and a collector connected to said base and said first signal line, and a second bipolar transistor having an emitter connectable to receive said first voltage, a base connected to the base of said first bipolar transistor, and a collector through which said second mirror current is output; and
  said second current mirror circuit means comprises a third bipolar transistor having an emitter connectable to receive said first voltage, a base connected to said second signal line, and a collector connected to said second signal line, and a fourth bipolar transistor having an emitter connectable to receive said first voltage, a base connected to said second signal line, and a collector through which said fourth mirror current is output.

7. The semiconductor memory device as claimed in claim 6, wherein said third current mirror circuit means comprises:
  a fifth transistor having a first terminal connectable to receive a second voltage, a second terminal connectable to receive said second mirror current, and a control terminal connectable to receive one of said second and fourth mirror currents; and
  a sixth transistor having a first terminal connectable to receive said second voltage, a second terminal connectable to receive said fourth mirror current, and a control terminal connected to the control terminal of said fifth transistor, said output signal being extracted from said second terminal of one of said fifth and sixth transistors.

8. The semiconductor memory device as claimed in claim 1, wherein each of said first current mirror circuit means and said second current mirror circuit means comprises:
  a first MIS transistor having a first terminal connectable to receive a first voltage, a second terminal, and a gate connected to a corresponding one of said first and second signal lines;
  a first bipolar transistor having a first terminal connectable to receive said first voltage, a second terminal connected to said corresponding one of said first and second signal lines, and a base;
  a first resistor connected between the base and second terminal of said first bipolar transistor, said first MIS transistor, said first bipolar transistor and said first resistor forming a first Darlington amplifier circuit;
  a second MIS transistor having a first terminal connectable to receive said first voltage, a second terminal, and a gate connected to a corresponding one of said first and second signal lines;
  a second bipolar transistor having a first terminal connectable to receive said first voltage, a second terminal connected to said corresponding one of said first and second signal lines, and a base; and
  a second resistor connected between the base and second terminal of said second bipolar transistor, said second MIS transistor, said second bipolar transistor and said second resistor forming a second Darlington amplifier circuit.

9. The semiconductor memory device as claimed in claim 8, wherein said third current mirror circuit means comprises:
  a third transistor having a first terminal connectable to receive a second voltage, a second terminal connectable to receive said second mirror current, and a control terminal connectable to receive one of said second and fourth mirror currents; and
  a fourth transistor having a first terminal connectable to receive said second voltage, a second terminal connectable to receive said fourth mirror current, and a control terminal connected to the control terminal of said third transistor, said output signal being extracted from said second terminal of one of said third transistor and said fourth transistor.

10. The semiconductor memory device as claimed in claim 8, wherein:
  said first and second MIS transistors comprise p-channel field effect transistors; and
  said first and second bipolar transistors comprise npn bipolar transistors.

11. A signal amplifier circuit comprising:
  first current mirror circuit means for outputting a first current to a first signal line and for outputting second and third mirror currents;
  second current mirror circuit means for outputting a fourth current to a second signal line and for outputting fifth and sixth mirror currents, said first and second signal lines forming a pair of complementary signal lines;

third current mirror circuit means for receiving said second and fifth mirror currents and for outputting a first output signal; and fourth current mirror circuit means for receiving said third and sixth mirror currents and for outputting a second output signal complementary to said first output signal.

12. A signal amplifier circuit as claimed in claim 11, wherein:

said first current mirror circuit means comprises a first transistor having a first terminal, a second terminal and a control terminal, a second transistor having a first terminal, a second terminal and a control terminal, and a third transistor having a first terminal, a second terminal and a control terminal; and said second current mirror circuit means comprises a fourth transistor having a first terminal, a second terminal and a control terminal, a fifth transistor having a first terminal, a second terminal and a control terminal, and a sixth transistor having a first terminal, a second terminal and a control terminal, wherein:

said first terminal of each of said first through sixth transistors is connectable to receive a first voltage;

said second terminal of said first transistor, and said control terminal of each of said first through third transistors are connected to said first signal line; and said second and third mirror currents are output via said second terminals of said second and third transistors, respectively, and wherein:

said second terminal of said fourth transistor, and said control terminal of each of said fourth, fifth and sixth transistors are connected to said second signal line; and said fifth and sixth mirror currents are output via said second terminals of said fifth and sixth transistors, respectively.

13. A signal amplifier circuit as claimed in claim 12, wherein:

said first, second, third, fourth, fifth and sixth transistors are p-channel MIS transistors;

said first terminal of each of said first through sixth transistors corresponds to a source;

said second terminal of each of said first through sixth transistors corresponds to a drain; and said control terminal of each of said first through sixth transistors corresponds to a gate.

14. A signal amplifier as claimed in claim 12, wherein:

said first, second, third, fourth, fifth and sixth transistors are pnp bipolar transistors;

said first terminal of each of said first through sixth transistors corresponds to an emitter;

said second terminal of each of said first through sixth transistors corresponds to a collector; and said control terminal of each of said first through sixth transistors corresponds to a base.

15. A signal amplifier circuit as claimed in claim 12, wherein:

said first transistor has a mutual conductance which is k times that of each of said second and third transistors where k is equal to or larger than 1; and said fourth transistor has a mutual conductance which is k times that of each of said fifth and sixth transistors.

16. A signal amplifier circuit as claimed in claim 11, wherein said first current mirror circuit means comprises:

first, second and third MIS transistors, each having a first terminal, a second terminal and a control terminal;

first, second and third bipolar transistors, each having a first terminal, a second terminal and a control terminal; and first, second and third resistors, wherein said second current mirror circuit means comprises:

fourth, fifth and sixth MIS transistors, each having a first terminal, a second terminal and a control terminal;

fourth, fifth and sixth bipolar transistors, each having a first terminal, a second terminal and a third terminal; and fourth, fifth and sixth resistors, wherein:

said first terminals of said first through sixth MIS transistors, and said first terminals of said first through sixth bipolar transistors are connectable to receive a first voltage;

said second terminals of said first through sixth MIS transistors are respectively connected to said control terminals of said first through sixth bipolar transistors;

said first through sixth resistors are respectively connected between said second terminals and control terminals of said first through sixth bipolar transistors;

said second terminal of said first bipolar transistor is connected to said first signal line;

said second and third mirror currents are respectively output via said second terminals of said second and third bipolar transistors;

said second terminal of said fourth bipolar transistor is connected to said second signal line; and said fifth and sixth mirror currents are output via said second terminals of said fifth and sixth bipolar transistors.

17. A signal amplifier circuit as claimed in claim 13, wherein:

said third current mirror circuit means comprises means having a first path connectable to selectively receive a second voltage, for outputting said second mirror current as said first output signal by preventing said fifth mirror current from passing through said first path toward said second voltage on the basis of the potential of said second signal line; and said fourth current mirror circuit means comprises means having a second path connectable to selectively receive a second voltage, for outputting said sixth mirror current as said second output signal by preventing said third mirror current from passing through said second path toward said second voltage on the basis of the potential of said first signal line.

18. A signal amplifier circuit as claimed in claim 14, wherein:

said third current mirror circuit means comprises means having a first path connectable to selectively receive a second voltage, for outputting said second mirror current as said first output signal by preventing said fifth mirror current from passing through said first path toward said second voltage on the basis of the potential of said second signal line; and said fourth current mirror circuit means comprises means having a second path connectable to selectively receive a second voltage, for outputting said sixth mirror current as said second output signal by preventing said third mirror current from passing through said second path toward said second voltage on the basis of the potential of said first signal line.

19. A signal amplifier circuit as claimed in claim 16, wherein:

said third current mirror circuit means comprises means having a first path connectable to selectively receive a second voltage, for outputting said second mirror current as said first output signal by preventing said fifth mirror current from passing through said first path toward said second voltage on the basis of the potential of said second signal line; and said fourth current mirror circuit means comprises means having a second path connectable to selectively receive a second voltage, for outputting said sixth mirror current as said second output signal by preventing said third mirror current from passing through said second path toward said second voltage on the basis of the potential of said first signal line.

20. A signal amplifier circuit as claimed in claim 11, wherein:

said third current mirror circuit means comprises a first transistor having a first terminal, a second terminal and a control terminal, and a second transistor having a first terminal, a second terminal and a control terminal;

said first terminal of said first transistor receives said second mirror current from a first voltage via said first current mirror circuit, and said first terminal of said second transistor receives said fifth mirror current from said first voltage via said second current mirror circuit means;

said second terminal of each of said first and second transistors is connected to receive a second voltage; and said control terminal of each of said first and second transistors is connected to said first terminal of one of said first and second transistors, and wherein:

said fourth current mirror circuit means comprises a third transistor having a first terminal, a second terminal and a control terminal, and a fourth transistor having a first terminal, a second terminal and a control terminal;

said first terminal of said third transistor receives said third mirror current from said first voltage via said first current mirror circuit means, and said first terminal of said fourth transistor receives said sixth mirror current from said first voltage via said second current mirror circuit means;

said second terminal of each of said third and fourth transistors is connected to receive said second voltage; and said control terminal of each of said third and fourth transistors is connected to said first terminal of one of said third and fourth transistors.

21. A semiconductor memory device comprising:
a memory cell array having a plurality of memory cells coupled to word lines and pairs of first and second bit lines;

pairs of first and second data buses;

select means for selecting said memory cells and for coupling selected memory cells to said pairs of first and second data buses via said pairs of first and second bit lines;

sense amplifier means, provided for said pairs of first and second bit lines, for amplifying potential differences between said pairs of first and second bit lines; and data bus signal amplifier circuits respectively provided for the pairs of first and second data buses and outputting readout data based on said potential differences, wherein each of said data bus signal amplifier circuits comprises:

first current mirror circuit means for passing a first current through said first data bus and for outputting second and third mirror currents;

second current mirror circuit means for passing a fourth current through said second data bus and for outputting fifth and sixth mirror currents;

third current mirror circuit means for receiving said second and fifth mirror currents and for outputting a first output signal;

fourth current mirror circuit means for receiving said third and sixth mirror currents and for outputting a second output signal, said first and second output signals being complementary to each other and corresponding to said readout data;

write means for writing input data into said selected memory cells; and control means for making said data bus signal amplifier circuits inactive during a time when said write means writes said input data into said selected memory cells.

22. A semiconductor memory device as claimed in claim 21, further comprising current path means, provided for the pairs of first and second data buses, for passing respective predetermined currents from said first and second data buses toward a point set to a predetermined voltage.

23. A semiconductor memory device as claimed in claim 22, wherein:

said current path means comprises first and second diode function elements provided for each of said pairs of first and second data buses;

said first diode function element has an anode connected to said first data bus, and a cathode connectable to receive said predetermined voltage; and said second diode function element has an anode connected to said second data bus, and a cathode connectable to receive said predetermined voltage.

24. A semiconductor memory device as claimed in claim 21, wherein:

said select means comprises a first transistor and a second transistor provided for each of said pairs of first and second bit lines;

said first transistor having a first terminal connected to a corresponding one of said first data buses, a second terminal connectable to selectively receive a predetermined voltage, and a control terminal connected to a corresponding one of said first bit lines; and said second transistor having a first terminal connected to a corresponding one of said second data buses, a second terminal connectable to selectively receive said predetermined voltage, and a control terminal connected to a corresponding one of said second bit lines.

25. A semiconductor memory device as claimed in claim 21, wherein said control means comprises:
first switch means, provided for each of said first data buses, for disconnecting a corresponding one of said first data buses from a corresponding one of said data bus signal amplifier circuits during the time when said write means writes said input data into said selected memory cells; and
second switch means, provided for each of said second data buses, for disconnecting a corresponding one of said second data buses from said corresponding one of said data bus signal amplifier circuits during the time when said write means writes said input data into said selected memory cells.

26. A semiconductor memory device as claimed in claim 21, wherein:
said first current mirror circuit means provided for each of said pairs of first and second data buses comprises a first transistor having a first terminal, a second terminal and a control terminal, a second transistor having a first terminal, a second terminal and a control terminal, and a third transistor having a first terminal, a second terminal and a control terminal; and
said second current mirror circuit means provided for each of said pairs of first and second data buses comprises a fourth transistor having a first terminal, a second terminal and a control terminal, a fifth transistor having a first terminal, a second terminal and a control terminal, and a sixth transistor having a first terminal, a second terminal and a control terminal,
wherein:
said first terminal of each of said first through sixth transistors is connectable to receive a predetermined voltage;
said second terminal of said first transistor, and said control terminal of each of said first through third transistors are connected to said first data bus; and
said second and third mirror currents are output via said second terminals of said second and third transistors, respectively, and
wherein:
said second terminal of said fourth transistor, and said control terminal of each of said fourth, fifth and sixth transistors are connected to said second data bus; and
said fourth and fifth mirror currents are output via said second terminals of said fifth and sixth transistors, respectively.

27. A semiconductor memory device as claimed in claim 21, wherein said first current mirror circuit means provided for each of said pairs of first and second data buses comprises:
first, second and third MIS transistors, each having a first terminal, a second terminal and a control terminal;
first, second and third bipolar transistors, each having a first terminal, a second terminal and a control terminal; and
first, second and third resistors,
wherein said second current mirror circuit means provided for each of said pairs of first and second data buses comprises:
fourth, fifth and sixth MIS transistors, each having a first terminal, a second terminal and a control terminal;
fourth, fifth and sixth bipolar transistors, each having a first terminal, a second terminal and a third terminal; and
fourth, fifth and sixth resistors,
wherein:
said first terminals of said first through sixth MIS transistors, and said first terminals of said first through sixth bipolar transistors are connectable to receive a predetermined voltage;
said second terminals of said first through sixth MIS transistors are respectively connected to said control terminals of said first through sixth bipolar transistors;
said first through sixth resistors are respectively connected between said second terminals and control terminals of said first through sixth bipolar transistors;
said second terminal of said first bipolar transistor is connected to said first data bus;
said second and third mirror currents are respectively output via said second terminals of said second and third bipolar transistors;
said second terminal of said fourth bipolar transistor is connected to said second data bus; and
said fifth and sixth mirror currents are output via said second terminals of said fifth and sixth bipolar transistors.

* * * * *